United States Patent [19]

Yasuda et al.

[11] 4,207,617

[45] Jun. 10, 1980

[54] MEMORY ERASE AND MEMORY READ-OUT IN AN EL DISPLAY PANEL CONTROLLED BY AN ELECTRON BEAM

[75] Inventors: Shuhei Yasuda; Toshihiro Ohba, both of Tenri; Chugi Suzuki, Nara; Masayoshi Koba, Tenri; Jun Kudo, Nara, all of Japan

[73] Assignee: Sharp Kabushiki Kaisha, Osaka, Japan

[21] Appl. No.: 919,960

[22] Filed: Jun. 28, 1978

[30] Foreign Application Priority Data

| | | | |
|---|---|---|---|
| Jun. 29, 1977 | [JP] | Japan | 52-78116 |
| Sep. 29, 1977 | [JP] | Japan | 52-118293 |
| Sep. 29, 1977 | [JP] | Japan | 52-118294 |
| Oct. 12, 1977 | [JP] | Japan | 52-122641 |

[51] Int. Cl.$^2$ ........................ G11C 11/42; G11C 13/04

[52] U.S. Cl. .................................... 365/111; 365/106; 365/218

[58] Field of Search ................ 365/106, 111, 128, 218

[56] References Cited

U.S. PATENT DOCUMENTS 3,573,753 4/1971 Skelly .................................. 365/128

*Primary Examiner*—Terrell W. Fears

*Attorney, Agent, or Firm*—Birch, Stewart, Kolasch & Birch

[57] ABSTRACT

An EL display panel comprising an electroluminescent element made of, for example, a ZnS:Mn layer sandwiched between a pair of dielectric layers exhibits hysteresis properties within light intensity versus applied voltage characteristics. A front electrode is formed on one of the dielectric layers, and a rear electrode is formed on the other dielectric layer in order to apply a sustaining voltage signal across the electroluminescent element for maintaining the memoried display information. An electron beam is applied to a desired position on the EL display panel through the rear electrode at a time when the sustaining voltage signal bears the zero level in order to erase the memoried information. The memoried display information is electrically read out by detecting a polarization relaxation current which flows through a memoried display position when an electron beam is applied thereto.

18 Claims, 26 Drawing Figures

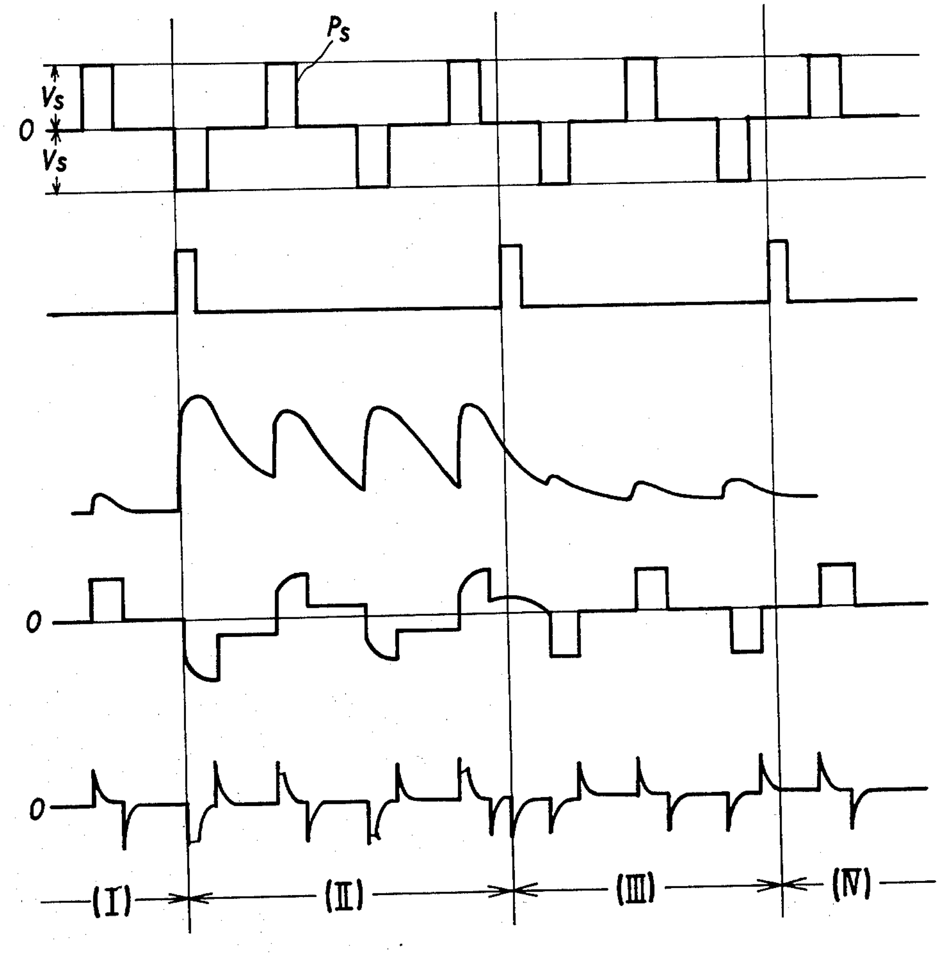
FIG. 3 (A)
FIG. 3 (B)
FIG. 3 (C)
FIG. 3 (D)
FIG. 3 (E)
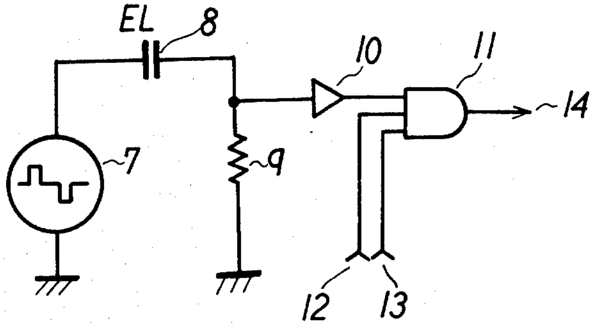
FIG. 4

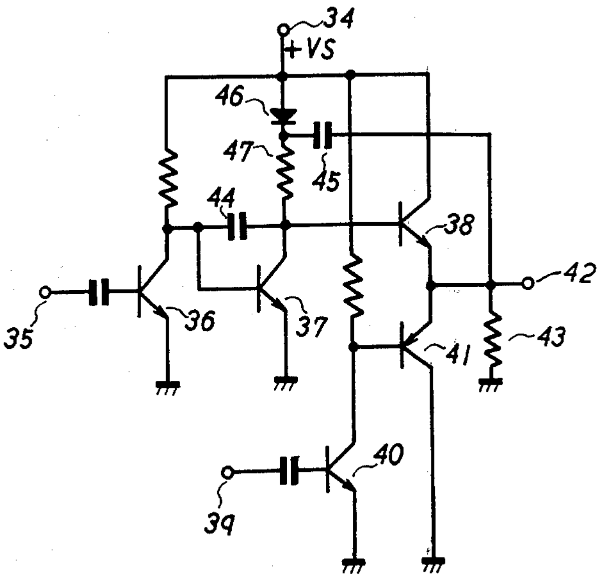
FIG. 8
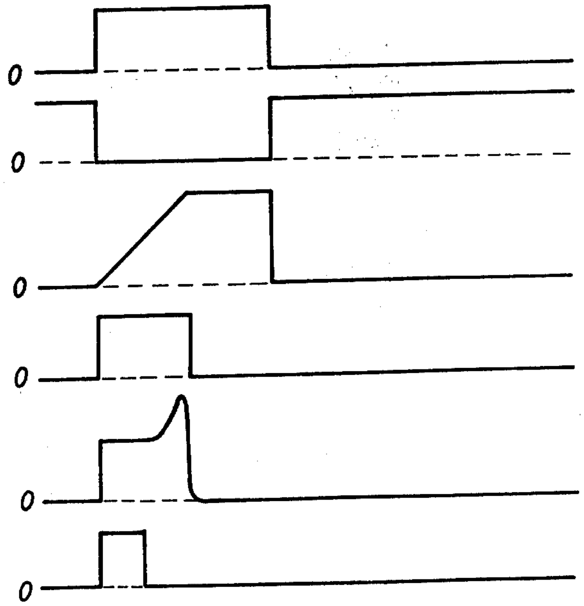
FIG. 9(A)
FIG. 9(B)
FIG. 9(C)
FIG. 9(D)
FIG. 9(E)
FIG. 9(F)

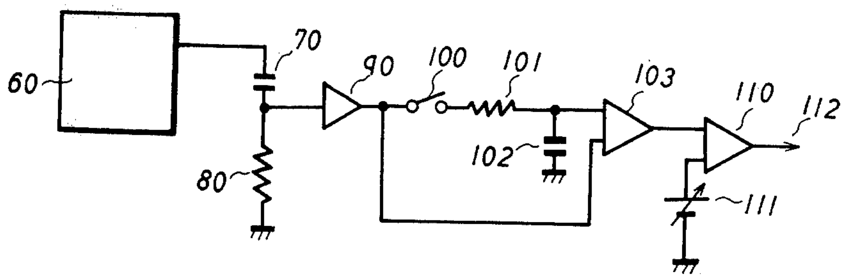
FIG. 10
FIG. 11(A)
FIG. 11(B)
FIG. 11(C)
FIG. 11(D)
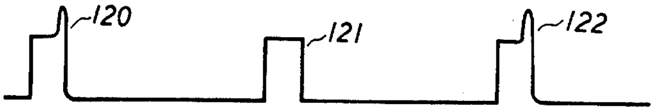
FIG. 11(E)
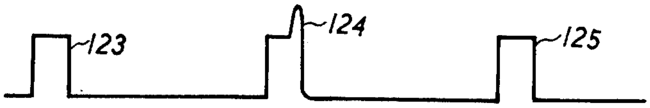
FIG. 11(F)
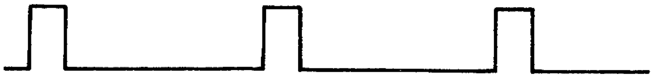

MEMORY ERASE AND MEMORY READ-OUT IN AN EL DISPLAY PANEL CONTROLLED BY AN ELECTRON BEAM

BACKGROUND AND SUMMARY OF THE INVENTION

The present invention relates to a drive system of an EL display panel and, more particularly, to a memory erase drive and memory read-out drive in an EL display panel which shows memory characteristics.

A thin-film electroluminescent element of a three-layer construction is well known in the art, which comprises a semiconductor electroluminescent thin film made of, for example, a ZnS layer doped with Mn (ZnS:Mn) and a ZnSe layer doped with Mn(ZnSe:Mn) sandwiched between a pair of dielectric thin films made of $Y_2O_3$, $Si_3N_4$ or $TiO_2$. The above-mentioned thin-film electroluminescent element exhibits electroluminescence of high brightness upon receiving A.C. voltage signal of several kilohertz. And, the above-mentioned thin-film electroluminescent element shows the long life operation.

By properly controlling the amount of Mn doped within the electroluminescent layer and the fabrication conditions, the above constructed thin-film EL element exhibits the hysteresis properties within light intensity versus applied voltage characteristics as disclosed in Y. KANATANI et al, U.S. Pat. No. 3,967,112, "PHOTO-IMAGE MEMORY PANEL AND ACTIVATING METHOD THEREOF" on June 29, 1976.

Generally, when light energy, an electric field or heat energy is applied to the thin-film EL element having the hysteresis characteristics under a condition where the applied voltage is increased, the thin-film EL element is excited to exhibit light emission corresponding to the applied energy. The thus obtained light emission is held or memoried even after the application of the light energy, the electric field or the heat energy is terminated. By effectively utilizing the above-mentioned memory phenomenon, the thin-film EL element can be applied to various technical fields.

Accordingly, an object of the present invention is to provide a novel drive system for a thin-film EL element having hysteresis characteristics.

Another object of the present invention is to provide a drive system for erasing memoried information in a thin-film EL element having hysteresis characteristics.

Still another object of the present invention is to provide a drive system for reading-out memoried information in a thin-film EL element having hysteresis characteristics.

Yet another object of the present invention is to combine a sustaining voltage signal with an electron beam erase signal in a thin-film EL display panel which shows hysteresis characteristics.

A further object of the present invention is to combine a sustaining voltage signal with an electron beam read-out signal in a thin-film EL display panel which shows hysteresis characteristics.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a thin-film EL display panel is provided which comprises a thin-film EL layer made of, for example, a ZnS:Mn thin film sandwiched between a pair of dielectric layers made of $Y_2O_3$, $Si_3N_4$ or $TiO_2$. A front transparent electrode made of $SnO_2$ or $In_2O_3$ is formed on one of the dielectric layers, and a rear metal electrode made of, for example, aluminum is formed on the other dielectric layer. The thus formed thin-film EL element is supported by a glass substrate in such a manner that the front transparent electrode confronts the glass substrate.

The above constructed thin-film EL display panel is disposed at a display surface of a cathode-ray tube in such a manner that the glass substrate is exposed to the outside. An electron beam generator is disposed at an end of the cathode-ray tube for applying an electron beam to the thin-film EL display panel through the rear metal electrode.

An alternating sustaining voltage signal is applied to the thin-film EL element through the use of the front and rear electrodes in order to maintain the information displayed on the thin-film EL display panel. An electron beam is applied from the electron beam generator to a desired position on the thin-film EL display panel at a time when the sustaining voltage signal bears the zero level, thereby erasing the memoried information.

The memoried display information is electrically read out by detecting a polarization relaxation current which flows through a memoried display position when an electron beam is applied thereto.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 3(A) through 3(E) are time charts for explaining basic operation of an embodiment of a drive system of the present invention;

FIG. 4 is a block diagram of an essential part of an embodiment of a drive system of the present invention;

FIG. 8 is a circuit diagram of an embodiment of a read-out signal generator employed in the drive system of FIG. 6;

FIGS. 9(A) through 9(F) are time charts for explaining operation of the drive system of FIG. 6;

FIG. 10 is a circuit diagram of an embodiment of a polarization current detection circuit employed in the drive system of FIG. 6;

FIGS. 11(A) through 11(F) are time charts for explaining read-out operation.

DESCRIPTION OF THE PREFERRED EMBODIMENTS

Figure 1:
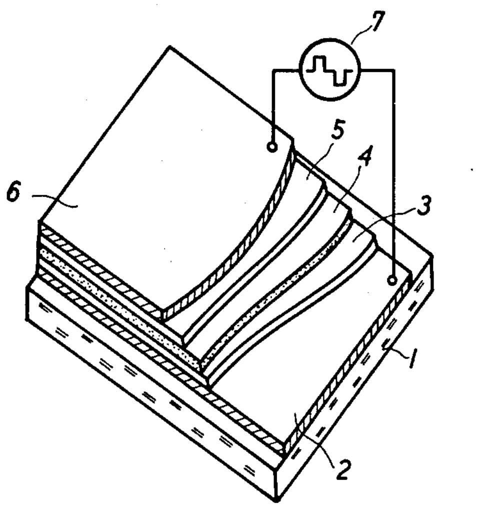
FIG. 1 is a schematic perspective view of a basic construction of a thin-film EL element employed in an embodiment of the present invention.

FIG. 1 shows a basic construction of a thin-film EL element employed in an embodiment of the present invention.

A transparent electrode 2 made of, for example, $SnO_2$ or $In_2O_3$ is formed on a glass substrate 1. A bottm insulation thin-film layer 3 made of, for example, $Y_2O_3$ or $Si_3N_4$ is formed on the transparent electrode 2, and a thin-film ZnS electroluminescence layer 4 doped with Mn is formed thereon. Thereafter, an upper insulation thin film layer 5 made of a same material as the layer 3 is formed on the thin-film ZnS electroluminenscence layer 4 to sandwich the thin-film ZnS electroluminescence layer 4 between the bottom and upper insulation thin film layers 3 and 5, and a rear metal electrode 6 made of, for example, aluminum is formed thereon. The bottom insulation thin film layer 3, the thin-film ZnS electroluminescence layer 4 and the upper insulation thin film layer 5 are sequentially formed through the use of, for example, an evaporation method or a sputtering method. The transparent electrode 2 and the rear metal electrode 6 are formed so as to cover the entire surface of the element, and are connected to an alternating voltage source 7 through lead wires.

Figure 2:
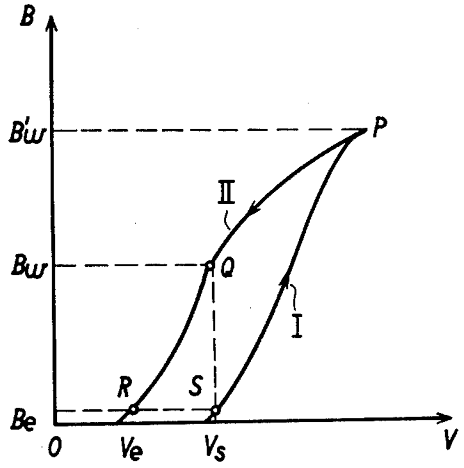
FIG. 2 is a graph showing hysteresis properties included within electroluminescent brightness versus applied voltage characteristics of the thin-film EL element of FIG. 1.

FIG. 2 is a graph showing hysteresis properties included within electroluminescent brightness versus applied voltage characteristics of a thin-film EL element employed in an embodiment of the present invention. The electroluminescent brightness [B] is shown along the ordinate axis, and the peak value [V] of the applied alternating voltage pulse signal is shown along the abscissa axis.

It will be clear from FIG. 2 that the hysteresis loop is observed in the voltage increasing curve I and the voltage decreasing curve II.

Preferably, a sustaining voltage $V_s$ is selected at a level where the difference is sufficiently large between the brightness $B_e$ in the voltage increasing curve and the brightness $B_w$ in the brightness decreasing curve. FIG. 3(A) shows the waveform of the sustaining voltage signal. The brightness $B_e$ will be referred to as an erase brightness $B_e$, and the brightness $B_w$ will be referred to as a write-in brightness $B_w$, respectively, hereinafter.

When an alternating sustaining pulse train $P_s$ (peak value $V_s$) as shown in FIG. 3(A) is applied to the thin-film EL element, the thin-film EL element exhibits the electroluminescence of the erase brightness $B_e$ at a point S of FIG. 2. The erase brightness $B_e$ is maintained by the alternating sustaining pulse train $P_s$.

When an amplitude of the alternating sustaining pulse train $P_s$ is momentarily increased, or when the light energy or the heat energy is momentarily applied to the thin-film EL element under the condition where the alternating sustaining voltage pulse is applied thereto, the brightness is momentarily increased to the level $B'_w$ corresponding to the point P of FIG. 2 and, thereafter, the brightness is held stationary at the write-in brightness $B_w$ corresponding to the point Q on the voltage decreasing curve II by the following alternating sustaining pulse (luminescence memory condition).

When the light energy or the heat energy is applied to the thin-film EL element at a time when the pulse train $P_s$ of the alternating sustaining voltage $V_s$ is applied thereto, or when a voltage higher than the alternating sustaining voltage $V_s$ is applied to the thin-film EL element, electrons captured in the electron trap level within the thin-film ZnS layer 4 of the thin-film EL element are excited to conduction by the number corresponding to the applied energy. The thus generated conduction electrons travel through the thin-film ZnS layer 4 and function to excite the Mn luminescent center formed in the thin-film ZnS layer 4. Therefore, the electroluminescent brightness of the thin-film EL element is increased.

When the amplitude of the alternating sustaining pulse applied to the thin-film EL element held in the luminescence memory condition is momentarily reduced to an erase voltage $V_e$, or when the light energy or the heat energy is applied to the thin-film EL element held in the luminescence memory condition at a time when the alternating sustaining pulse bears the zero level, the brightness of the thin-film EL element is momentarily reduced to the erase brightness $B_e$ corresponding to the point R of FIG. 2. Thereafter, the erase brightness $B_e$ is maintained at the point S of FIG. 2 by the following alternating sustaining pulse train $P_s$ (erase memory condition).

Moreover, the brightness of intermediate tones can be obtained between the write-in brightness $B_w$ and the erase brightness $B_e$ by the application of the sustaining voltage $V_s$ when the energy level of the voltage, light or heat applied to the thin-film EL element at the write-in operation or the erase operation is properly controlled.

The sustaining operation of the write-in brightness $B_w$ and the erase brightness $B_e$ in the thin-film EL element by the sustaining voltage $V_s$ are considered as follows.

When the light energy or the heat energy is applied to the thin-film EL element at a time when the sustaining voltage $V_s$ is applied thereto, or when the voltage higher than the sustaining voltage is applied to the thin-film EL element, the conduction electrons are swept toward the boundary area formed between the thin-film ZnS layer 4 and the thin-film insulation layer 3 or formed between the thin-film ZnS layer 4 and the thin-film insulation layer 5. That is, the thin-film EL element is polarized.

The thus swept conduction electrons are captured at the boundary level of the boundary area formed between the thin-film ZnS layer 4 and the thin-film insulation layer 3 or 5 even after the application of the light energy, the heat energy or the high voltage is removed. The thus captured conduction electrons are escaped from the boundary level to the conduction band by application of the following sustaining pulse, and travel through the thin-film ZnS layer 4 toward the opposing boundary area. Most of the conduction electrons are swept to the opposing boundary area without being re-trapped at the electron trap level formed in the thin-film ZnS layer 4, because the conduction electrons travel at a high speed due to the electric field established by the sustaining pulse. Therefore, the thin-film EL element maintains the write-in brightness $B_w$, or maintains the luminescence memory condition. In addition, the polarization generated in the thin-film EL element is also sustained.

When the light energy or the heat energy is applied to the thin-film EL element held in the luminescence memory condition (or polarized condition) at a time when the sustaining voltage pulse takes the zero level, or when the erase voltage $V_e$ is applied to the thin-film EL element held in the luminescence memory condition (or polarized condition), the conduction electrons swept at the boundary area formed between the thin-film ZnS layer 4 and the thin-film insulation layer 3 or 5 are released and, therefore, the polarization is relaxed. Accordingly, the sweep velocity of the conduction electrons traveling near the electron trap level is low when the following sustaining pulse is applied to the element. Most of the conduction electrons are re-trapped at the electron trap level formed in the thin-film ZnS layer 4 without reaching the opposing boundary area while they travel through the thin-film ZnS layer 4. The polarization is not formed again. Consequently, the thin-film EL element is held stationary in the erase memory condition to exhibits the erase brightness $B_e$.

The sweeping ratio of the conduction electrons can be controlled by varying the energy level applied at the erase operation. That is, the brightness of the thin-film EL element can be controlled by varying the energy level applied to the element.

In case where the electrodes are uniformly formed on the element to cover the entire surface of the element, clean display and memory can be obtained as compared with the element wherein the electrodes are formed in a matrix fashion. Moreover, the fabrication of the electrodes becomes easy. However, it was impossible, in the prior art, to electrically read out the memoried information by selecting a desired position.

The present invention provides a system wherein an electron beam is applied to a desired position on the thin-film EL element in order to erase the memoried information. In addition, the present invention provides a system wherein an electron beam is applied to a desired position on the thin-film EL element in order to read-out the memoried information by detecting a polarization relaxation current flowing through the thin-film EL element.

FIG. 4 shows an essential part of an embodiment of a drive system of the present invention. FIGS. 3(A) through 3(E) show various signals occurrring within the system of FIG. 4. FIG. 3(A) shows a waveform of a voltage pulse train $P_s$ applied from the alternating sustaining voltage source 7 to the thin-film EL element; FIG. 3(B) shows an electron beam exposure applied to the thin-film EL element; FIG. 3(C) shows a light emission waveform of the thin-film EL element; FIG. 3(D) shows polarization amount generated in the thin-film EL element; and FIG. 3(E) shows a current waveform flowing from a thin-film EL element 8 to a load impedance 9.

When the thin-film EL element is placed in the erase memory condition (period I), only a transient current flows through the thin-film EL element 8 in synchronization with the application of the voltage pulse train $P_s$. When an electron beam is applied to the thin-film EL element 8 in synchronization with the application of the sustaining voltage pulse train $P_s$, the thin-film EL element 8 exhibits the high brightness and the polarization is generated in the element (period II, the luminescence memory condition). At this moment, the polarization current flows through the load impedance 9 in addition to the transient current. The luminescence memory condition is sustained by the sustaining voltage $V_s$ of the sustaining voltage pulse train $P_s$ shown in FIG. 3(A).

When an electron beam is applied to the thin-film EL element 8 held in the luminescence memory condition at a time when the alternating sustaining voltage pulse train $P_s$ takes the zero level, the photo relaxation phenomenon is developed at a position to which the electron beam is applied. The erase operation is conducted as shown in FIG. 3(C). That is, the polarization charges stored in the boundary area of the thin-film EL element are relaxed by conduction electrons formed by the electron beam application.

In this way, a desired portion of the displayed pattern is erased. A negative display pattern can be easily obtained by applying the electron beam in a desired pattern after the entire display surface of the element is palced in the written condition.

In the above-mentioned period III, the polarization relaxation current flows through the load impedance 9 in synchronization with the application of the electron beam.

Even when the electron beam is applied to the thin-film EL element 8 held in the erase memory condition at a time when the alternating sustaining voltage signal takes the zero level (period IV), the polarization relaxation current does not flow through the load impedance 9. The intensity of the electron beam can not be too strong, because the strong electron beam applied to the thin-film EL element 8 will place the thin-film EL element 8 in the luminescence memory condition even when the electron beam is applied to the element at a time when the sustaining voltage signal takes the zero level.

The polarization relaxation current value will be proportional to the polarization amount when the thin-film EL element 8 exhibits the light emission of the intermediate tone between the write-in brightness $B_w$ and the erase brightness $B_e$.

Accordingly, the information stored at the position on the thin-film EL element to which the electron beam is applied at a time when the applied voltage takes the zero level is read-out by detecting the polarization relaxation current flowing through the load impedance 9.

Referring now to FIG. 4, the alternating sustaining voltage source 7 and the load impedance 9 such as a resistor R are connected to the thin-film EL element 8 in a series fashion. A gate circuit 11, which selectively transfers the polarization relaxation current signal, is connected to the thin-film EL element via an amplifier 10 (although the amplifier 10 is not necessarily required). The gate circuit 11 is controlled by a timing pulse 12, which controls the application timing of the alternating sustaining voltage pulse, and by another timing pulse 13, which controls the application timing of the electron beam. The polarization relaxation current signal 14 developed from the gate circuit 11 is applied to a recorder or an indicator (not shown).

The selective transfer of the polarization relaxation current signal 14, which indicates the information stored in the thin-film EL element 8, is controlled in the following manner. The timing pulse 12 is developed at a time when the alternating sustaining pulse signal bears the zero level, and the timing pulse 13 is developed at a time when the electron beam is generated. The gate circuit 11 is opened only when the timing pulses 12 and 13 are simultaneously applied thereto. The polarization relaxation current signal 14 incidates the information stored at the position in the thin-film EL element 8 to which the electron beam is applied.

Figure 5:
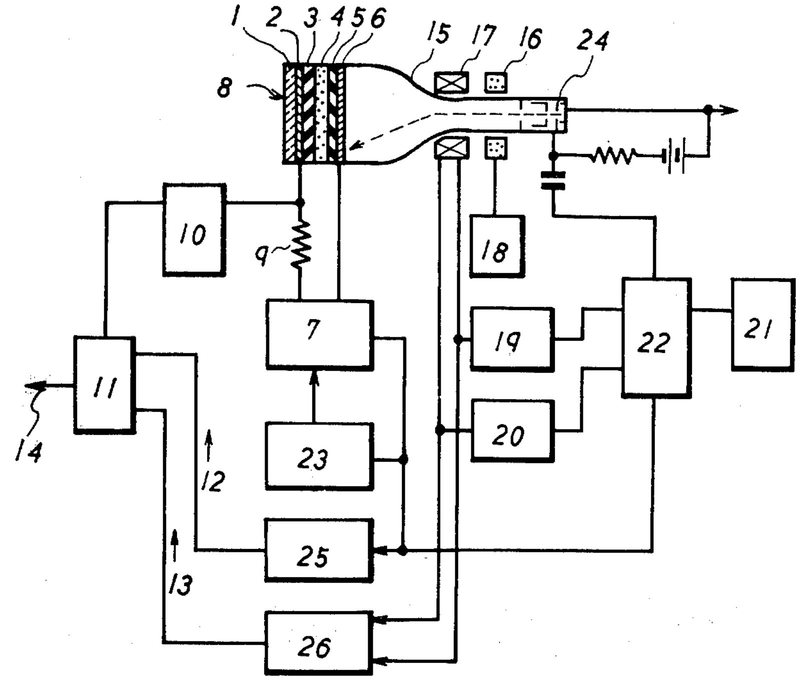
FIG. 5 is a block diagram of an embodiment of a drive system of the present invention.

FIG. 5 shows an embodiment of a drive system of the present invention, which controls the above-mentioned erase operation and read-out operation.

The thin-film EL element 8 having the same construction as shown in FIG. 1 is disposed at a display surface of a cathode-ray tube 15. That is, the glass substrate 1 defines the front surface of the cathode-ray tube 15. A focus control electro-magnetic coil 16 and an X–Y deflection coil 17 are disposed as is well known in the art. The focus control electro-magnetic coil 16 is connected to receive a control signal derived from an electron beam focus control signal generator 18, and the X–Y deflection coil 17 is connected to receive control signals derived from an X-direction deflection amplifer 19 and a Y-direction deflection amplifier 20. The amplifiers 19 and 20 are connected to receive signals derived from a scanning signal generator 22, which is connected to receive a video signal derived from a modulator 21.

The transparent electrode 2 and the rear metal electrode 6 of the thin-film EL element 8 are connected to receive the sustaining pulse voltage and the erase pulse voltage derived from the alternating sustaining voltage source 7 and an erase signal generator 23, respectively. The erase signal generator 23 is provided for conducting voltage controlled erase operation, and is not necessarily required. The alternating sustaining voltage source 7 and the erase signal generator 23 are connected to receive a synchronization signal derived from the scanning signal generator 22. An electron beam generator 24 is disposed at the end of the cathode-ray tube 15. The electron beam generator 24 is connected to receive a brightness control signal derived from the scanning signal generator 22.

An inverter circuit 25 is connected to the scanning signal generator 22. The inverter circuit 25 develops the timing pulse 12 to be applied to the gate circuit 11 for read-out purposes. An electron beam scanning position timing signal generator 26 is connected to the scanning signal generator 22 via the X and Y direction deflection amplifiers 19 and 20 in order to develop the timing pulse 13 which is applied to the gate circuit 11. The gate circuit 11 is connected to the thin-film EL element 8 via the amplifier 10.

In synchronization with the synchronization signal derived from the scanning signal generator 22, the sustaining voltage pulse of the amplitude $V_s$ is applied from the alternating sustaining voltage source 7 to the thin-film EL element. At this moment, the element exhibits the erase brightness $B_e$ shown in FIG. 2. A desired pattern signal is developed from the modulator 21 and applied to the scanning signal generator 22. The electron beam generator 24 generates an electron beam to be applied to the thin-film EL element 8 disposed at the display surface of the cathode-ray tube 15.

The electron beam generated from the electron beam generator 24 is focused by the focus control electro-magnetic coil 16 and directed to the thin-film EL element 8. The scanning signal generator 22 functions to control the strength of the electron beam, whereby the brightness of the electroluminescence is controlled. The application of the electron beam is timed in agreement with the application of the alternating sustaining voltage pulse. The electron beam is applied to the thin-film EL element 8 through the rear metal electrode 6. The position to which the electron beam is applied is controlled through the use of the X–Y deflection coil 17.

A position where the electron beam is impinged exhibits the brightness $B'_w$ at the point P shown in FIG. 2 and, then, the position is maintained at the write-in brightness $B_w$ by the following sustaining voltage pulse.

The position to which the electron beam is not applied is maintained at the erase brightness $B_e$. Accordingly, the display pattern is observed through the glass substrate 1. The display pattern can be characters, drawings, symbols or continuous patterns. The brightness is easily varied by controlling the strength of the electron beam. The entire display surface can be placed in the luminescent condition.

When an erase voltage pulse is applied from the erase signal generator 23, the entire display surface of the thin-film EL element is placed in the erase condition.

When the electron beam is applied to the element at a time when the alternating sustaining voltage signal bears the zero level, the position to which the electron beam is impinged is placed in the erase condition.

The read-out operation is conducted by applying the electron beam to the thin-film EL element at a time when the alternating sustaining voltage takes the zero level.

The electron beam scanning position timing signal generator 26 develops the timing pulse 13, and the inverter circuit 25 develops the timing pulse 12. Accordingly, the gate circuit 11 develops the polarization relaxation current signal 14 indicative of the information stored at a position on the thin-film EL element 8 to which the electron beam is applied. When the electron beam is applied to a desired position of the thin-film EL element 8 for the read-out purposes, the position is placed into the erase memory condition.

The write-in operation can be alternatively conducted by applying a light pattern to the thin-film EL element 8 through the glass substrate 1. The read-out operation is conducted by applying the electron beam to the thin-film EL element 8 through the rear metal electrode 6.

In the foregoing embodiment, the position held in the luminescence memory condition is placed into the erase condition, when the read-out operation is conducted. In the following embodiment, the luminescence memory condition is maintained even when the read-out operation is conducted.

Figure 6:
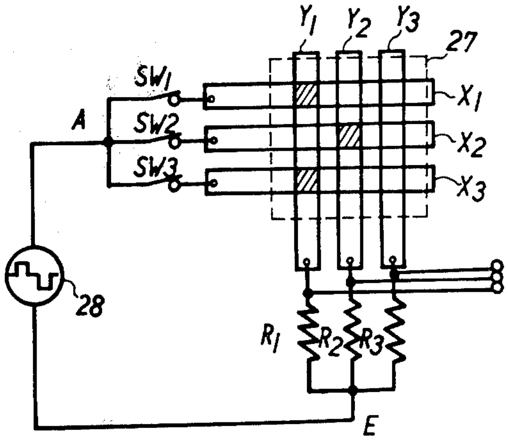
FIG. 6 is a schematic diagram of another embodiment of a drive system of the present invention.

FIG. 6 shows a basic construction of another embodiment of a drive system of the present invention, which employs a thin-film EL element 27 having matrix shaped electrodes $X_1$–$X_3$ and $Y_1$–$Y_3$.

The thin-film EL element 27 has a similar construction as that of FIG. 1, but has transparent front column electrodes $Y_1$ through $Y_3$, and rear metal row electrodes $X_1$ through $X_3$. An alternating pulse source 28 is connected to the thin-film EL element 27 to apply the alternating sustaining voltage signal to the thin-film EL element 27. Load impedance means such as resistors $R_1$ through $R_3$ are connected to the column electrodes $Y_1$ through $Y_3$, respectively, for read-out purposes. Selection switches $SW_1$ through $SW_3$ are connected to the row electrodes $X_1$ through $X_3$ in order to scan the sustaining operation and read-out operation. The number of electrodes is not limited to the embodiment of FIG. 6.

Figure 7:
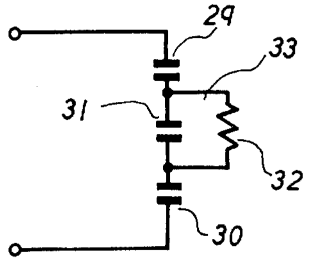
FIG. 7 is a circuit diagram of an equivalent circuit of a thin-film EL element employed in the present invention.

FIG. 7 shows the equivalent circuit of the thin-film EL element. The thin-film EL element can be considered to have a parallel circuit 33 including a non-linear resistor 32 and a capacitor 31. The parallel circuit 33 is connected to capacitors 29 and 30 in a seried fashion. The capacitor 31 corresponds to the capacitive component of the thin-film luminescent layer 4, and the capacitors 29 and 30 correspond to the capacitive components of the thin-film dielectric layers 3 and 5, respectively.

The non-linear resistor 32 can be considered as resistance against the travel of the conduction electrons in the thin-film luminescent layer 4.

When the thin-film EL element is in the erase condition, the non-linear resistor 32 takes the resistance value above several tens MΩ. Therefore, the thin-film EL element can be considered to be consisting of the capacitive component. Contrarily, when the thin-film EL element is in the written-in condition, the non-linear resistor 32 takes the resistance value of ten and several KΩ. Therefore, the electric current applied to the parallel circuit 33 will flow through the non-linear resistor 32.

As discussed above, the thin-film EL element can be considered as a type of capacitor. When an impedance means such as a resistor is connected to the thin-film EL element in a series fashion, a differentiation circuit can be formed, which develops a voltage signal across the impedance means. A rectangular waveform output signal can be obtained when a voltage signal having a predetermined inclination in the leading edge is applied to the differentiation cirucit. In case where the thin-film EL element is in the erase condition, a clear rectangular waveform output signal is obtained because the thin-film EL element acts as a capacitor. However, in case where the thin-film EL element is in the written-in condition, the output signal includes the crest portion near the end portion thereof because the thin-film EL element includes the resistance component therein. The information stored in the thin-film EL element can be read out by detecting the above-mentioned crest portion.

FIG. 8 shows an embodiment of a read-out voltage pulse generator which develops a voltage pulse having an amplitude identical with that of the sustaining voltage $V_S$ and a leading edge of a predetermined inclination.

A power source voltage of a same level as that of the sustaining voltage $V_S$ is applied to a terminal 34. When an input signal as shown in FIG. 9(A) is not applied to a terminal 35, a transistor 36 is OFF, a transistor 37 is ON, and a transistor 38 is OFF. Under these conditions, when a signal as shown in FIG. 9(B) is not applied to a terminal 39, transistors 40 and 41 are OFF. An output terminal 42 connected to the thin-film EL element is grounded through a resistor 43. At this moment, a capacitor 44 is maintained so that the terminal conneccted to the collector electrode of the transistor 36 is positive and the terminal connected to the collector electrode of the transistor 37 is negative. Another capacitor 45 is charged to the power source voltage level $V_S$ through a diode 46 and the resistor 43.

When the input signal as shown in FIG. 9(A) is applied to the terminal 35, the transistor 36 is turned ON and, therefore, the collector electrode of the transistor 36 and the base electrode of the transistor 37 are maintained at the zero level. The transistor 37 is turned OFF and, therefore, the capacitor 44 is charged so that the terminal connected to the collector electrode of the transistor 37 becomes positive and the terminal connected to the base electrode of the transistor 37 becomes negative. Accordingly, the transistor 38 begins to become conductive.

At this moment, the capacitor 45, which had already been charged to the power source voltage level $V_S$, is connected to the power supply source through the short circuit including the transistor 38. Therefore, the cathode terminal of the diode 46 receives a voltage of twice the power supply level and, hence, the diode 46 is biased backward. The capacitor 44 is charged by the twice voltage through the resistor 47. The charging period can be controlled by varying the resistance value of the resistor 47 and the capacitance value of the capacitor 44. The charging time constant functions to determine the inclination angle of the leading edge of the output pulse signal to be applied to the thin-film EL element. When the capacitor 44 is charged to the power supply voltage level $V_S$, the base-collector junction of the transistor 38 is biased forward and, therefore, the output level does not exceed the power supply voltage level $V_S$.

When the input pulse as shown in FIG. 9(B) is applied to the terminal 39 under the condition where the input pulse as shown in FIG. 9(A) takes the zero level, the transistors 40 and 41 are turned ON, whereby the discharge period of the thin-film EL element connected to the output terminal 42 is reduced. FIG. 9(C) shows an output pulse derived from the output terminal 42, the output pulse having a leading edge of a predetermined inclination.

FIG. 10 shows an embodiment of a polarization current detection circuit connected to the thin-film EL current.

A read-out pulse generator 60 is connected to a thin-film EL element 70 which is shown by a capacitor. The read-out pulse generator 60 has a same construction as shown in FIG. 8 to develop the read-out pulse having a leading edge of a predetermined inclination. An impedance means 80 such as a resistor is connected to the thin-film EL element 70 in a series fashion. The impedance means 80 represents one of the resistors $R_1$ through $R_3$ shows in FIG. 6. A buffer amplifier 90 is connected to the connection point of the thin-film EL element 70 and the impedance means 80.

An output signal of the buffer amplifier 90 is directly applied to one input terminal of a differentiation amplifier 103. The output signal of the buffer amplifier 90 is also applied to another input temrinal of the differentiation amplifier 103 via a switching element 100 such as a transistor and a resistor 101. The connection point of the resistor 101 and the input terminal of the differentiation amplifier 103 is grounded through a capacitor 102. An output signal of the differentiation amplifier 103 is applied to one input terminal of a comparator 110, which includes the other input terminal connected to a power supply source 111. The comparator 110 develops a read-out detection signal 112.

When the read-out pulse as shown in FIG. 9(C) is applied from the read-out pulse generator 60 to the thin-film EL element 70, an electric current flows through the thin-film EL element 70, and a voltage signal is developed across the resistor 80. In case where the thin-film EL element 70 is placed in the erase condition, the detection output signal is a rectangular waveform of a predetermined amplitude as shown in FIG. 9(D). In case where the thin-film EL element 70 is placed in the written-in condition, the crest portion is observed in the detection output signal as shown in FIG. 9(E) due to the polarization current.

The switching element 100 is closed in synchronization with the leading edge of the read-out pulse or slightly after the occurrence of the leading edge of the read-out pulse. The capacitor 102 is charged through the resistor 101. The switching element 100 is controlled to open before the crest portion appears. Accordingly, the input terminal of the differentiation amplifier 103 connected to the switching element 100 receives a signal as shown in FIG. 9(F).

A period $\tau$ during which the switching element 100 is closed is selected to satisfy the following relationship.

$$\tau \approx (C_o R_o / 3)$$

where:

$R_o$ is a resistance value of the resistor 101; and $C_o$ is a capacitance value of the capacitor 102.

At a time when the polarization current flows through the element, the one input terminal of the differentiation amplifier 103 receives the signal of the level substantially zero. Therefore, the crest portion is amplified by the differentiation amplifier 103. And, the polarization current component is developed from the comparator 110.

In the embodiment of FIG. 10, the both input terminals of the differentiation amplifier 103 receive the signal derived from the same element and, therefore, the accurate read out operation is conducted.

Read out operation will be described in detail with reference to an embodiment of FIG. 6, wherein the thin-film EL element has electrodes formed in a 3 x 3 matrix fashion.

Now assume that write-in operation is conducted to picture points ($X_1$, $Y_1$), ($X_3$, $Y_1$) and ($X_2$, $Y_2$) by applying the electron beam under the condition where the selection switches $SW_1$ through $SW_3$ are closed to apply the sustaining voltage pulse between two terminals A and E. Then, the selection switches $SW_1$ through $SW_3$ are opened to electrically separate the row electrodes $X_1$ through $X_3$. Thereafter, the read-out pulse shown in FIG. 9(C) is sequentially applied to the row electrodes $X_1$ through $X_3$. An electric current flows through the resistors $R_1$ through $R_3$ in response to the application of the read-out pulse to the row electrodes $X_1$ through $X_3$.

An example of the read out operation will be described with reference to FIGS. 11(A) through 11(F). FIGS. 11(A) through 11(C) show read-out voltage signals applied to the row electrodes $X_1$ through $X_3$, respectively. FIGS. 11(D) through 11(F) show detection output signals obtained via the resistors $R_1$ through $R_3$, respectively.

The picture points ($X_1$, $Y_1$), ($X_3$, $Y_1$) and ($X_2$, $Y_2$) have written information. The resistors $R_1$ through $R_3$ receive displacement currents 121, 123 and 125 shown in FIGS. 11(D) and 11(E) and shown in FIG. 11(F), and polarization currents 120, 122 and 124 superimposed on the displacement currents as shown in FIGS. 11(D) and 11(E). The detection outputs corresponding to the respective picture points can be obtained by detecting the row electrode to which the read-out voltage pulse is applied and the column electrode connected to each of the resistors $R_1$ through $R_3$. For example, the output current 120 corresponds to the picture point ($X_1$, $Y_1$). The output current 122 corresponds to the picture point ($X_3$, $Y_1$), and the output current 124 corresponds to the picture point ($X_2$, $Y_2$). The written portion is not damaged by the above-mentioned read out operation. And, the erroneous write-in operation will not be conducted to the erase point by the read out operation. This is because the read-out voltage pulse has the same amplitude as the sustaining voltage level $V_s$.

Figure 12:
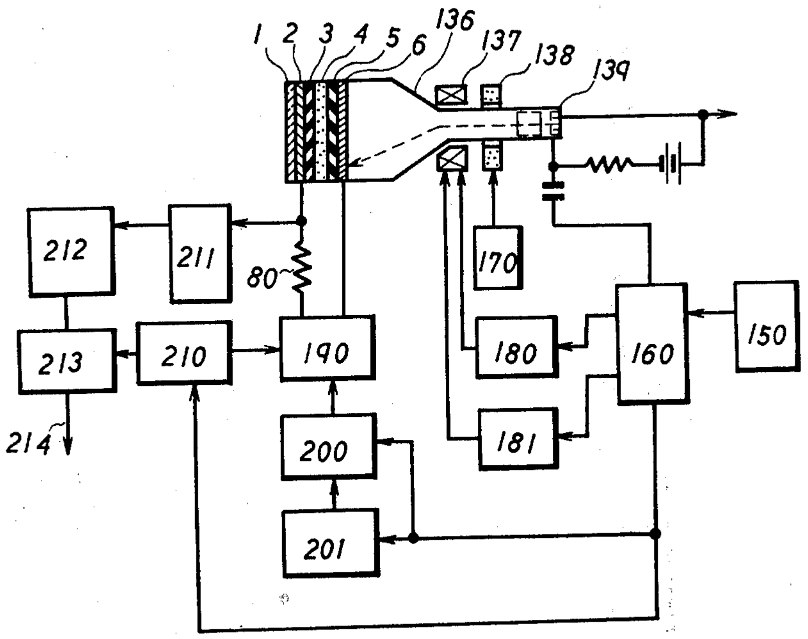
FIG. 12 is a block diagram of the drive system of FIG. 6.

FIG. 12 shows another embodiment of the drive system of the present invention, which embodies the electron beam write-in operation and the electrical read-out operation.

The thin-film EL element of the construction as shown in FIG. 6 is disposed at a display surface of a cathode-ray tube 136. That is, the glass substrate 1 (see FIG. 1) defines the front surface of the cathode-ray tube 136.

A focus control electro-magnetic coil 138 and an X–Y deflection coil 137 are disposed as is well known in the art. The focus control electro-magnetic coil 138 is connected to receive a control signal derived from an electron beam focus control signal generator 170. The X–Y deflection coil 137 is connected to receive control signals derived from an X-direction deflection amplifier 180 and a Y-direction deflection amplifier 181. The amplifiers 180 and 181 are connected to receive signals derived from a scanning signal generator 160, which is connected to receive a video signal derived form a modulator 150.

The transparent column electrodes 2 and the rear metal row electrodes 6 of the thin-film EL element are connected to a gate driver circuit 190 which selects the write-in operation and the read-out operation. The gate drive circuit 190 is connected to a sustaining pulse signal generator 200 and a read-out pulse generator 210. An erase signal generator 201 is associated with the sustaining pulse signal generator 200. The sustaining pulse signal generator 200 and the erase signal generator 201 are connected to receive a synchronization signal derived from the scanning signal generator 160. An electron beam generator 139 is disposed at the end of the cathode-ray tube 136. The electron beam generator 139 is connected to receive a brightness control signal derived from the scanning signal generator 160.

A detection circuit 211 and a differentiation amplifier/comparator 212 of the construction as shown in FIG. 10 are connected to the thin-film EL element. A read-out signal synchornization detection circuit 213 is connected to the read-out pulse generator 210, which is connected to the scanning signal generator 160, and the differentiation amplifier/comparator 212, thereby developing a read-out signal 214.

When write-in operation is desired to be performed, the gate drive circuit 190 functions to pass the sustaining pulse signal toward the thin-film EL element. In synchronization with the signal derived from the scanning signal generator 160, the sustaining pulse signal generator 200 develops the sustaining pulse voltage to be applied to the thin-film EL element. The thin-film EL element exhibits the erase brightness $B_e$. A desired pattern signal is developed from the modulator 150. The scanning signal generator 160 controls to impinge the electron beam generated from the electron beam generator 139 at a desired position of the thin-film EL element which is positioned on the display surface of the cathode-ray tube 136. The point to which the electron beam is applied exhibits the write-in brightness $B_w$ as in the case of the embodiment of FIG. 5.

When erase operation is desired to be conducted, the erase pulse is developed from the erase signal generator 201, thereby electrically erasing the written information. When read-out operation is desired to be performed, the gate driver circuit 190 functions to pass the read-out pulse toward the thin-film EL element. The read-out pulse generator 210 functions to apply the read-out pulse shown in FIG. 9(C) to the thin-film EL element.

The application of the read-out pulse is scanned through the use of the selection switches $SW_1$ through $SW_3$ shown in FIG. 6. Then, the read-out signal 214 is developed from the read-out signal synchronization detection circuit 213, the read-out signal 214 indicating the memory condition of a point to which the read-out pulse is applied.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A drive system for erasing information written on a thin-film EL element including a thin-film EL layer sandwiched between a pair of electrodes, said drive system comprising:

means for applying a voltage signal between said pair of electrodes;

means for applying an electron beam to said thin-film EL element through one of said pair of electrodes; and control means for applying said electron beam to a desired position on said thin-film EL element at a time when said voltage signal is at a level which will not excite the thin-film EL element thereby erasing information from said EL element.

2. The drive system of claim 1, wherein said electron beam is applied to the thin-film EL element when said voltage signal takes the substantially zero level.

3. The drive system of claim 1, wherein said control means comprise:

detection means for detecting the electron beam; and synchronization means for synchronizing the application of the electron beam with the application of said voltage signal.

4. The drive system of claim 1, 2 or 3, wherein said thin-film EL element comprises:

a thin-film ZnS layer doped with manganese;

a pair of dielectric layers formed on both major surface of said thin-film ZnS layer;

a front transparent electrode formed on one of said pair of dielectric layers; and a rear metal electrode formed on the other dielectric layer, and wherein said electron beam is applied to the thin-film EL element through said rear metal electrode.

5. The drive system of claim 4, wherein said thin-film EL element has the hysteresis characteristics, and said voltage signal comprises an alternating pulse voltage signal.

6. The drive system of claim 4, wherein said front transparent electrode and said rear metal electrode are formed uniformly on the entire surface of a display region of said thin-film element.

7. A drive system for reading out information written on a thin-film EL element including a thin-film EL layer sandwiched between a pair of electrodes, said drive system comprising:

means for applying a voltage signal between said pair of electrodes;

means for applying an electron beam to said thin-film EL element through one of said pair of electrodes;

control means for applying said electron beam to a desired position on said thin-film EL element at a time when said voltage signal level is substantially zero; and detection means for detecting an electric current flowing through said thin-film EL layer when said electron beam is applied to said thin film EL element, thereby reading out information written on said EL current.

8. The drive system of claim 7, wherein said control means comprise:

deflection means for scanning said thin-film EL element by said electron beam; and synchronization means for synchronizing the application of the electron beam with the application of said voltage signal.

9. The drive system of claim 7, wherein said detection means comprise a selection means for selectively detecting a polarization relaxation current flowing through said thin-film EL element.

10. The drive system of claim 7, 8 or 9, wherein said thin-film EL element comprises:

a thin-film ZnS layer doped with manganese;

a pair of dielectric layers formed on both major surface of said thin-film ZnS layer;

a front transparent electrode formed on one of said pair of dielectric layers; and a rear metal electrode formed on the other dielectric beam is applied to said thin-film EL element through said rear metal electrode.

11. The drive system of claim 10, wherein said thin-film EL element has the hysteresis characteristics, and said voltage signal comprises an alternating sustaining pulse voltage signal.

12. The drive system of claim 11, wherein said voltage signal further comprises an erase pulse voltage signal for electrically erasing information written on said thin-film EL element.

13. The drive system of claim 10, wherein said front transparent electrode and said rear electrode are formed uniformly on the entire surface of a display region of said thin-film EL element.

14. The drive system of claim 13, wherein said detection means are correlated with said deflection means for determining the position from which the polarization relaxation current is detected.

15. A drive system for a thin-film EL element including a thin-film El layer sandwiched between a pair of dielectric layers and a pair of electrodes formed on both dielectric layers, said thin-film EL element exhibiting the hysteresis memory function for storing information, said drive system comprising:

means for generating an electron beam toward said thin-film EL element;

means for deflecting said electron beam in order to apply said electron beam to a desired position on said thin-film EL element;

means for applying an alternating sustaining voltage signal between said pair of electrodes;

means for applying a read-out voltage signal between said pair of electrodes, said read-out voltage signal having an amplitude substantially identical with that of the alternating sustaining voltage signal, and said read-out voltage signal having a leading edge of a predetermined inclination; and means for detecting an electric current flowing through said thin-film EL element at a time when said read-out voltage signal is applied between said pair of electrodes, whereby the stored information is recovered.

16. The drive system of claim 15, wherein said pair of electrodes comprise:

transparent front column electrodes formed on one of said pair of dielectric layers; and rear metal row electrodes formed on the other dielectric layer, whereby picture points are determined by said column and row electrodes.

17. A drive system for erasing information written on a thin-film EL element including a thin-film EL layer sandwiched between a pair of electrodes, said drive system comprising:

means for applying an alternating sustaining voltage signal between said pair of electrodes;

means for applying an electron beam to said thin-film EL element through one of said pair of electrodes; and control means for applying said electron beam to a desired position on said thin-film EL element at a time when said voltage signal is at a level which will not excite the thin-film EL element thereby erasing information from said EL element.

18. A drive system for reading-out information written on a thin-film EL element including a thin-film EL layer sandwiched between a pair of electrodes, said drive system comprising:

means for applying an alternating sustaining voltage signal between said pair of electrodes;

means for applying an electron beam to said thin-film EL element through one of said pair of electrodes;

control meansfor applying said electron beam to a desired position on said thin-film EL element at a time when said voltage signal level is substantially zero; and detection means for detecting an electric current flowing through said thin-film EL layer when said electron beam is applied to said thin-film EL element, thereby reading out information written on said EL element.

* * * * *